(12) United States Patent
Wei et al.

(10) Patent No.: US 9,070,420 B2
(45) Date of Patent: Jun. 30, 2015

(54) MEMORY SHARING SYSTEM AND MEMORY SHARING METHOD

(75) Inventors: Chunkai Derrick Wei, Hsinchu Hsien (TW); Po-Sung Huang, Hsinchu Hsien (TW); Yi Ling Chen, Hsinchu Hsien (TW); Ming-Chieh Yeh, Hsinchu Hsien (TW); Chih-Chieh Lee, Hsinchu Hsien (TW)

(73) Assignee: MStar Semiconductors, Inc., Hsinchu Hsien (TW)

( * ) Notice: Subject to any disclaimer, the term of this patent is extended or adjusted under 35 U.S.C. 154(b) by 548 days.

(21) Appl. No.: 13/085,801

(22) Filed: Apr. 13, 2011

(65) Prior Publication Data

US 2011/0314214 A1 Dec. 22, 2011

(30) Foreign Application Priority Data

Jun. 22, 2010 (TW) .................. 99120331 A

(51) Int. Cl.
*G06F 12/06* (2006.01)
*G06F 1/12* (2006.01)
*G11C 7/00* (2006.01)
*G06F 13/00* (2006.01)

(52) U.S. Cl.
CPC . *G11C 7/00* (2013.01); *G06F 13/00* (2013.01)

(58) Field of Classification Search
CPC ....... G06F 13/00; G06F 13/42; G06F 13/423; G06F 13/4217; G06F 13/4291; G06F 13/4243; G06F 13/1689; G06F 1/10; G06F 1/08; G06F 1/12; G06F 1/04; G06F 1/06; G06F 12/00; G06F 3/00
USPC .................. 711/167, 106, E12.078, E12.001; 713/400, 401, 500; 375/376
See application file for complete search history.

(56) References Cited

U.S. PATENT DOCUMENTS

| | | | | |
|---|---|---|---|---|
| 4,368,514 A * | 1/1983 | Persaud et al. | ................ | 709/211 |
| 5,418,937 A * | 5/1995 | Inoue | ............................ | 714/47.3 |
| 6,243,793 B1* | 6/2001 | Aucsmith et al. | ............. | 711/151 |
| 6,483,753 B1* | 11/2002 | Lin | ........................... | 365/189.02 |
| 6,584,588 B1* | 6/2003 | Pawate et al. | ................... | 714/719 |
| 6,754,746 B1* | 6/2004 | Leung et al. | .................. | 710/100 |
| 7,133,995 B1* | 11/2006 | Isaac et al. | ..................... | 711/204 |
| 7,334,149 B1* | 2/2008 | Wu | ............................... | 713/500 |
| 8,149,166 B1* | 4/2012 | Buxa | .............................. | 342/372 |
| 8,341,344 B2* | 12/2012 | Krishnan et al. | ............. | 711/105 |
| 2003/0196059 A1* | 10/2003 | Satagopan et al. | ............ | 711/169 |
| 2004/0123006 A1* | 6/2004 | Stuber et al. | .................... | 710/240 |
| 2004/0139258 A1* | 7/2004 | Chambers | ...................... | 710/110 |
| 2004/0205420 A1* | 10/2004 | Seeley et al. | ..................... | 714/57 |
| 2004/0234000 A1* | 11/2004 | Page | .............................. | 375/259 |
| 2005/0083099 A1* | 4/2005 | Lin | ................................. | 327/295 |
| 2005/0206419 A1* | 9/2005 | Kizer et al. | .................... | 327/158 |
| 2005/0220235 A1* | 10/2005 | Stark et al. | ..................... | 375/354 |
| 2008/0279320 A1* | 11/2008 | Rocas et al. | .................... | 375/355 |
| 2009/0195281 A1* | 8/2009 | Tamura et al. | ................. | 327/163 |
| 2009/0248971 A1* | 10/2009 | Horowitz et al. | ............. | 711/105 |
| 2010/0306460 A1* | 12/2010 | Hara | ............................. | 711/105 |
| 2011/0219171 A1* | 9/2011 | Kuehne et al. | ................. | 711/103 |

\* cited by examiner

*Primary Examiner* — Yong Choe
*Assistant Examiner* — Edward Waddy, Jr.
(74) *Attorney, Agent, or Firm* — Edell, Shapiro & Finnan, LLC

(57) ABSTRACT

A memory sharing system includes a master control device, a slave control device and a memory device. The master control device selectively generates a clock signal to the memory device. The slave control device receives and tracks the clock signal via a delay phase locked loop (DLL) to generate and align an output signal with the clock signal. The master control device arbitrates an access right.

16 Claims, 6 Drawing Sheets

MEMORY SHARING SYSTEM AND MEMORY SHARING METHOD

CROSS REFERENCE TO RELATED PATENT APPLICATION

This patent application is based on Taiwan, R.O.C. patent application No. 099120331 filed on Jun. 22, 2010.

FIELD OF THE INVENTION

The present invention relates to memory sharing, and more particularly, to a memory sharing system, a memory sharing apparatus and an operating method thereof applicable to a new-generation memory device having a high data transmission rate.

BACKGROUND OF THE INVENTION

In recent years, with development of science and technology, storage apparatuses and storage techniques have seen significant developments. In particular, as modern society's thirst for information continues to grow, various information processing devices, e.g., personal computers, laptop computers, smart phones and personal digital assistants (PDAs), have become indispensable tools in the daily life of many people. Accordingly, demand for storage apparatuses, e.g., memory devices, has also increased.

Generally, in an information processing device, a data bus of a memory device is coupled to an arbiter, for providing data storage or access via the data bus to a plurality of control devices, such as a central processing unit (CPU), a video processor, an audio processor or other peripheral devices, wherein the arbiter determines to which control device the dominance of the data bus currently belongs.

With the ever-increasing demand for processing devices that support real-time applications, e.g., synchronous media play, image retrieving or recording, and phone communication in multimedia applications, and ever-increasing improvements in the capabilities of CPUs, there is a commensurate requirement for higher transmission rates for memory devices. As an example, double data rate dynamic random access memory (DDR-DRAM) on the market today has a clock frequency up to hundreds of MHz, but even this level of capability is likely to become insufficient in the near future.

Therefore, one main object of the present invention is to provide improvements in memory systems.

SUMMARY OF THE INVENTION

According to an embodiment of the present invention, a memory sharing system comprises a master control device, a slave control device and a memory device. The master control device, coupled to the memory device via a data bus, transmits a clock signal to the memory device. The slave control device, coupled to the memory device via the data bus and coupled to the master control device, comprises a delay phase-locked loop (PLL) (hereinafter "delay PLL" or "DLL"). The slave control device receives the clock signal, and the delay PLL tracks the clock signal. The master control device and the slave control device access the memory device via the data bus. Preferably, the slave control device transmits a request signal to the master control device to request an access right of the memory device, and the master control device transmits a grant signal in response to the request signal to grant the access right of the memory device for the slave control device. Preferably, the master control device simultaneously monitors data transmission of the data bus. When the master control device is to recall the access right of the data bus, the master control device transmits a recall signal to the slave control device, which returns the access right of the data bus back to the master control device within a predetermined time period according to the recall signal. Preferably, the slave control device transmits an all-page-down command to the memory device and returns back the access right of the data bus. The master control device or the slave control device periodically transmits a refreshing command to the memory device. The delay PLL receives the clock signal, and tracks a phase of the clock signal to generate an output signal, e.g., a data strobe (DQS) signal or a command signal, so that the slave control device can access the memory device via the data bus. Preferably, the master control device further generates a clock enable signal to the memory device, and selectively generates a clock signal to the memory device in response to the clock enable signal.

According to another embodiment, a memory sharing method is applicable to a memory sharing system comprising a master control device, a slave control device and a memory device. The method comprises the master control device selectively generating a clock signal to the memory device; the slave control device receiving the clock signal, and tracking the clock signal via a DLL to generate an output signal, e.g., a DQS signal or a command signal, making the output signal align with the clock signal; and the master control device arbitrating an access right of the memory device. Preferably, the slave control device transmits a request signal to the master control device to request the access right of the memory device, and the master control device transmits a grant signal to the salve control device in response to the request signal. Preferably, the master control device transmits a recall signal to the slave control device, which returns the access right of the memory device back to the master control device within a predetermined time period in response to the recall signal.

The advantages and spirit related to the present invention can be further understood via the following detailed description and drawings.

DETAILED DESCRIPTION OF THE PREFERRED EMBODIMENT

One main objective of the present invention is to provide a memory sharing system, a system sharing apparatus and an operating method thereof.

Figure 1:
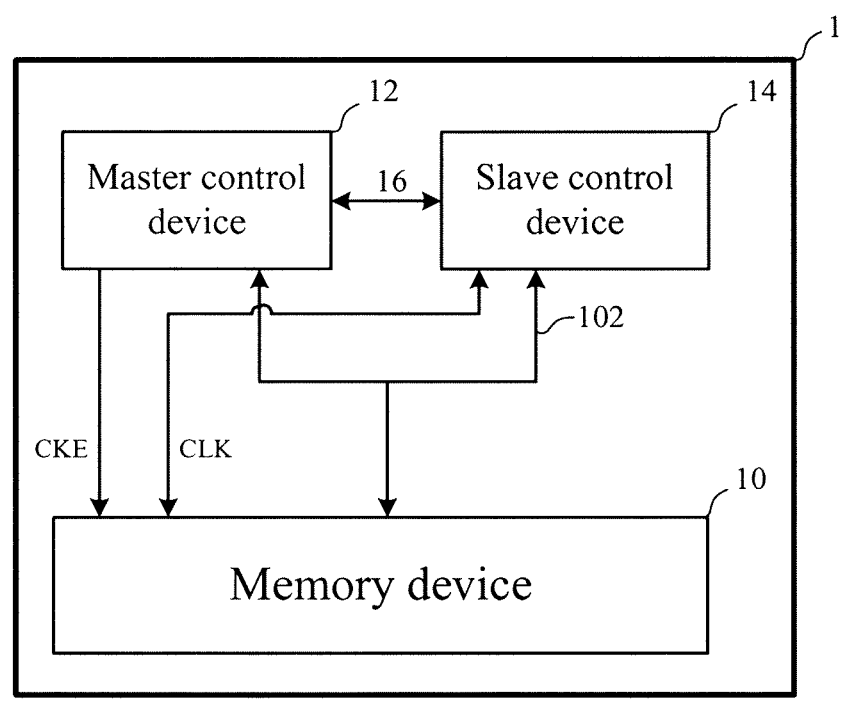
FIG. 1 is a block diagram of a memory sharing system according to an embodiment of the present invention.

FIG. 1 is a block diagram of a memory sharing system according to a first embodiment of the present invention. A memory sharing system 1 comprises a memory device 10, a master control device 12, and a slave control device 14. The master control device provides a memory clock signal CLK to the memory device 10 and the slave control device 14. The slave control device 14 is coupled to the master control device 12 via a bi-directional control bus 16. The master control device 12, the slave control device 14 and the memory device 10 are coupled to a data bus 102. The memory device 10 may be any type of memory, e.g., a DDR-DRAM. The master control device 12 or the slave control device 14 may be a control device capable of accessing the memory device 10, e.g., a microprocessor, but is not limited herein. For example, the bi-directional control bus 16 is for transmitting signals comprising a request signal, a grant signal and a recall signal. In this embodiment, the master control device 13 provides a memory clock signal CLK to the memory device 10 as a reference for data access. When data is to be accessed, with the master control device 12 transmitting a clock enable signal CKE and the memory clock signal CLK to the memory device 10, the master control device 12 and the slave control device 14 share the memory device 10 via communication of the bi-directional control bus 16, so as to reduce unnecessary power consumption.

Figure 2:
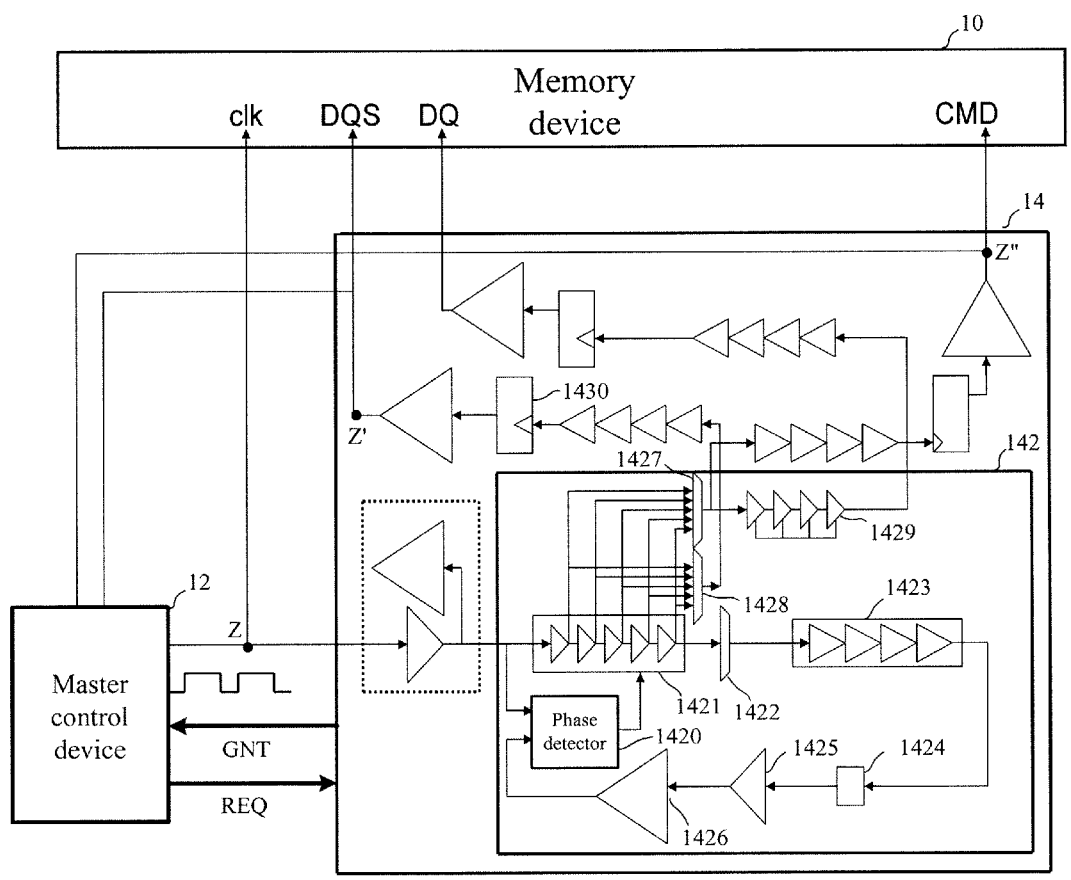
FIG. 2 is a block diagram of detailed circuits of a delay phase locked loop (DLL) of a slave control device according to an embodiment of the present invention.

FIG. 2 is a schematic diagram of detailed circuits of a delay PLL of the slave control device 14 in FIG. 1. Upon receiving a clock signal Z from the master control device 12, a delay PLL 142 of the slave control device 14 tracks a phase of the clock signal Z to output a reference signal. A pin clk of the memory device 10 in FIG. 2 represents a clock pin, a pin DQS represents a data strobe (DQS) pin, a pin DQ represents a data pin, and a pin CMD represents a command pin.

For example, the memory device 10 may be a DDR-DRAM, which respectively transmits data at a rising edge and a falling edge of a clock signal during interface data transmission, such that a data transmission rate of the DDR-DRAM can be twice of the data transmission rate of a conventional DRAM. The DDR-DRAM further comprises a two-way data DQS pin DQS as a reference for double data rate access.

As shown in FIG. 2, supposing that the clock frequency is 200 MHz, when the clock signal Z outputted from the master control device 12 to the slave control device 14 enters the delay PLL 142, the clock signal Z is processed in sequence to be matched by a multiplexer 1422, CTS replicated by a clock tree synthesis (CTS) replicator 1423, processed by a flip-flop 1424, input end delay replicated by an input end delay replicator 1425 and output end delay replicated by an output end delay replicator 1426. After that, a phase detector 1420 detects a phase of the clock signal Z, and outputs a detection result to a variable delayer 1421, whereby the delay PLL 142 adjusts the phase of the clock signal Z by delays selected via a multiplexer 1427 and a multiplexer 1428, respectively.

In this embodiment, when the memory device 10 is to be accessed, the slave control device 14 transmits a request signal REQ to the master control device 12 that responds with a grant signal GNT to the slave control device. The slave control device 14 performs CTS delay of 2 to 5 ns to a reference signal outputted by the multiplexer 1428, and the flip-flop 1430 processes the reference signal to generate a control signal Z', which is outputted to the DQS pin DQS of the memory device 10. Via processing of the delay PLL 142, the slave control device 14 matches an input end delay, an output end delay and delays of associated components in fabrication, such that the phase of the obtained control signal Z' is aligned with that of the clock signal Z originally inputted into the slave control device 14.

Figure 3:
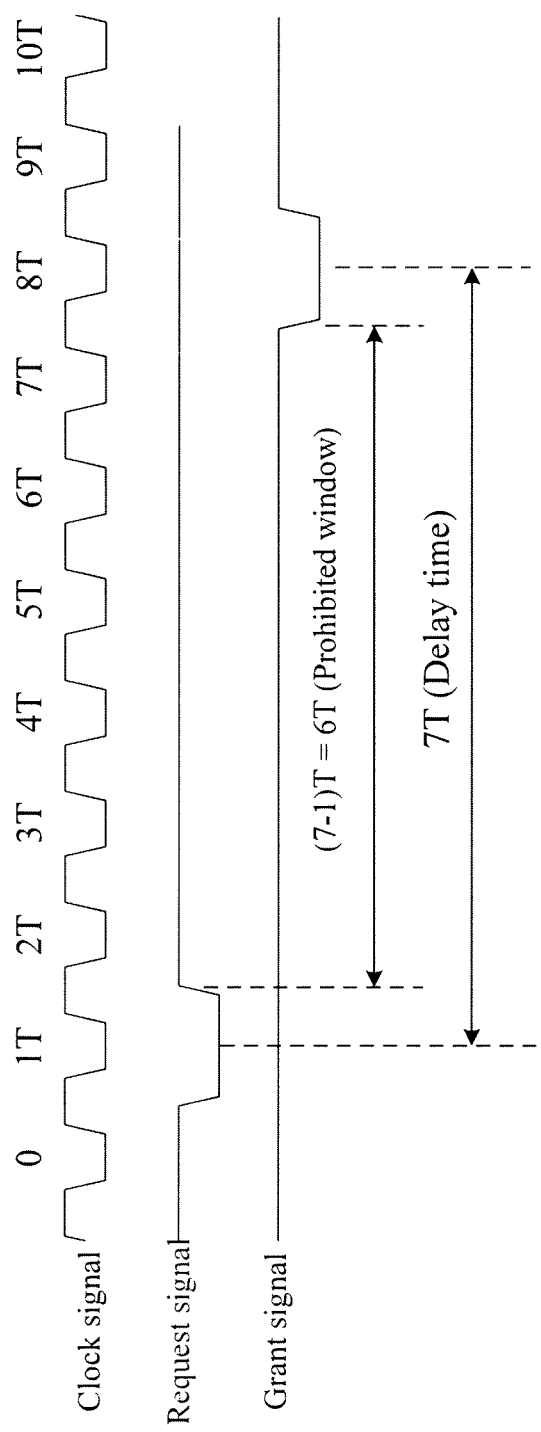
FIG. 3 is a schematic diagram of relationships among a request signal, a grant signal and a clock signal according to an embodiment of the present invention.

FIG. 3 is a schematic diagram of relationships among a request signal, a grant signal and a clock signal according to an embodiment of the present invention. A delay time period is defined from the slave control device transmitting the request signal to the salve control device receiving the grant signal, e.g., the delay time period is 7 T, wherein T is a clock cycle, meaning that a prohibited window time period is as long as (7−1)T=6 T. Within the prohibited window time period, the slave control device 14 is prohibited from performing any memory access operation.

In this embodiment, supposing that the slave control device 14 currently possesses the access right of the memory device 10, before the slave control device 14 returns the access right of the data bus 102 back to the master control device 12, preferably, an all-page-close command is transmitted via a command signal CMD to a memory device 10 to avoid page conflict in a memory bank of the memory device 10. In addition, the slave control device 14 also periodically transmits a refreshing command via the command signal CMD to the memory device 10 for refreshing memory data.

The master control device 12 and the slave control device 14 monitor data transmission of the data bus 102 via the command signal CMD, for facilitating a control device not yet possessing the access right of the data bus 102 (e.g., the master control device 12) to track opened pages of the memory bank of the memory device 10, so as to avoid page conflict once the master control device 12 recalls the access right of the data bus 102 from the slave control device 14.

Figure 4:
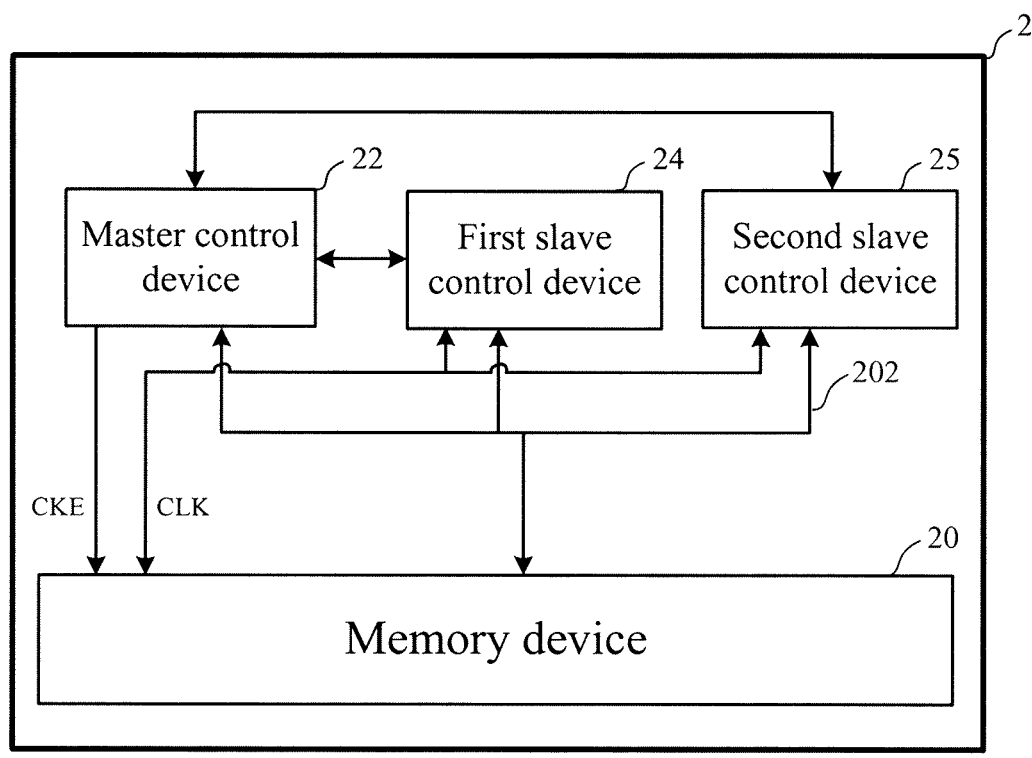
FIG. 4 is a block diagram of a memory sharing system according to an embodiment of the present invention.

FIG. 4 is a block diagram of a memory sharing system according to an embodiment of the present invention. The memory sharing system 2 comprises a memory device 20, a master control device 22, a first slave control device 24 and a second slave control device 25. The master control device 22 provides a memory clock signal CLK to the memory device 20, the first slave control device 24 and the second slave control device 25. The first slave control device 24 and the second slave control device 25 are respectively coupled to the master control device 22.

Please note that the memory sharing system 2 comprises two slave control devices 24 and 25. In practice, the number of slave control devices in the memory sharing system 2 can be varied to three, five or more according to practical requirements, and is not limited herein.

In this embodiment, the master control device 22 provides the memory clock signal CLK to the memory device 20. The master control device 22 transmits a clock enable signal CKE to the memory device 20 only when a data access is needed, so as to reduce unnecessary power consumption. The master control device 22 provides the memory clock signal CLK to the memory device 20, the first slave control device 24 and the second slave control device 25, so as to provide a reference for generating data and commands by the first slave control device 24 and the second slave control device 25.

When the first slave control device 24 receives the memory clock signal CLK from the master control device 22, a built-in DLL (not shown) of the first slave control device 24 tracks a phase of the memory clock signal CLK to output a first reference signal. When the second slave control device 25 receives the memory clock signal CLK from the master control device 22, a built DLL (not shown) of the second slave control device 25 tracks the phase of the memory clock signal CLK to output a second reference signal, such that the memory clock signal CLK inputted into the second slave control device 25 can be aligned with a data and command signal outputted from the second slave control device 25. For example, upon being granted an access right of the memory device 20 by the master control device 22, the first slave control device 24 generates an output signal according to the first reference signal outputted by the DLL, such that a phase of the output signal outputted from the first slave control device can be aligned with that of the memory clock signal CLK received by the first slave control device 24.

Alternatively, upon being granted an access right of the data bus 202 by the master control device 22, the second slave control device 25 generates an output signal according to the second reference signal outputted by the DLL, such that a phase of the output signal outputted from the second slave control device 25 can be aligned with that of the memory clock signal CLK. Preferably, through adequately matching a trace length of the memory clock signal CLK transmitted from the master control device 22 to the memory device 20 with that from the master control device 22 to the first slave control device 24 and the second slave control device 25, the first slave control device 24 and the second slave control device 25 can accurately transmit a data signal DQ, a strobe signal DQS and a command signal CMD according to the reference clock signal CLK to access the memory device 20. Detailed operations of the DLLs of the first slave control device 24 and the second slave control device 25 are similar to those illustrated in FIG. 2 and associated descriptions, and are omitted herein.

In this embodiment, supposing that the first slave control device 24 currently possesses the access right of the data bus 202, before releasing the access right of the data bus 202, the first slave control device 24 first transmits an all-page-close command to the memory device 20 to avoid page conflict in a memory bank of the memory device 20. Other control devices not yet possessing the access right of the data bus 202, e.g., the master control device 22 and the second slave control device 25, may real-time monitor data transmission of the data bus 202 to track the access right of the data bus 202 so as to avoid page conflict in the memory bank of the memory device 20 once other control devices take over the access right of the data bus 202 from the first slave control device 24.

Figure 5:
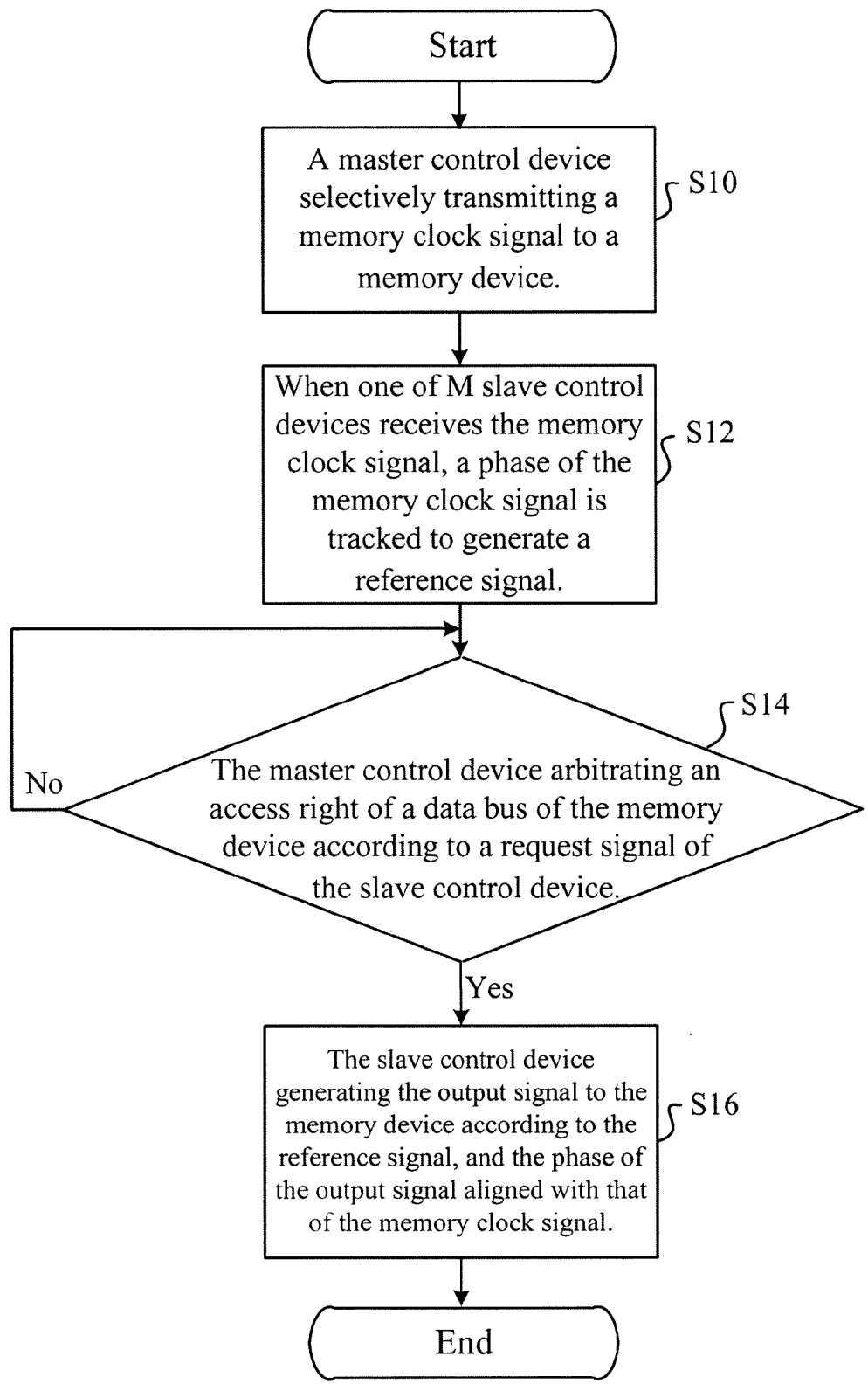
FIG. 5 is a flowchart of an operating method for a memory sharing system according to an embodiment of the present invention.

FIG. 5 is a flowchart of a memory sharing method according to an embodiment of the present invention. In Step S10, a master control device selectively transmits a memory clock signal to a memory device. In Step S12, when one of M slave control devices receives the memory clock signal, a phase of the memory clock signal is tracked to generate a reference signal. Preferably, the memory clock signal is delay phase-locked via a built-in DLL of the slave control device to align an output signal of the slave control device with the memory clock signal. In Step S14, the master control device arbitrates an access right of a data bus of the memory device according to a request signal of the slave control device. When an arbitration result of Step S14 is that the access right of the data bus is granted to the slave control device, the flow proceeds to Step S16, in which the slave control device generates the output signal to the memory device according to the reference signal, so that the phase of the output signal is aligned with that of the memory clock signal. When the arbitration result of Step S14 is negative, the slave control device continues to wait. For example, all control devices monitor command and data transmission of the data bus, such that control devices not yet possessing the access right of the data bus, e.g., the master control device, tracks opened pages of the memory bank of the memory device to avoid page conflict once the master control device recalls the access right of the data bus. Preferably, the memory sharing method provided by the present disclosure further comprises periodically transmitting a refreshing command to the memory device. When M is larger than 1, i.e., when the memory sharing system comprises more than one slave control device, preferably, the refreshing command is transmitted by the master control device.

Figure 6:
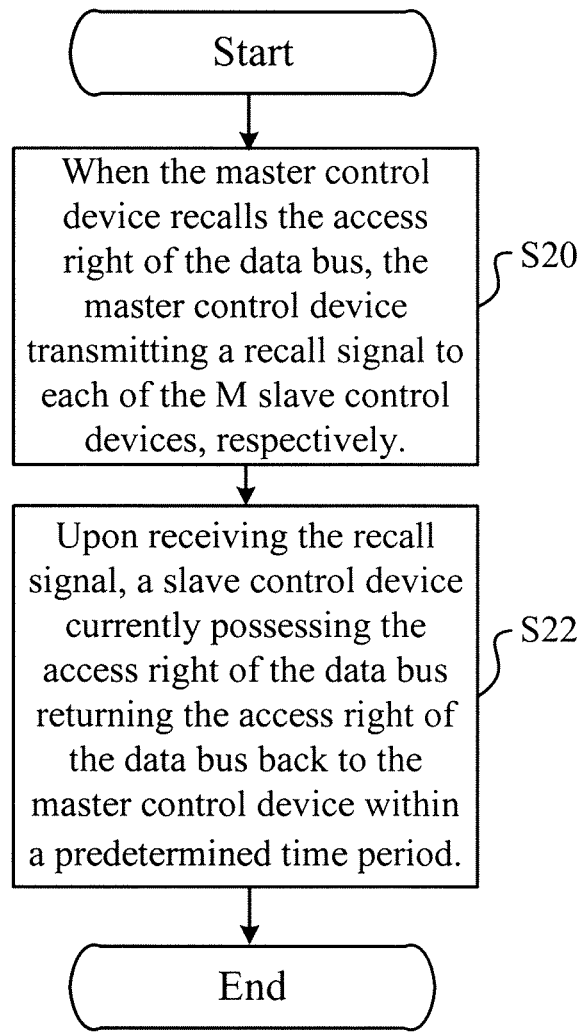
FIG. 6 is a flowchart of a master control device recalling an access right from a slave control device that currently possesses the access right according to an embodiment of the present invention.

FIG. 6 is a flowchart of a master apparatus recalling an access right of a data bus from a slave control device currently possessing the access right of the data bus when M is larger than or equal to 1, according to an embodiment of the present invention. In Step S20, when the master control device recalls the access right of the data bus, the master control device transmits a recall signal to each of the M slave control devices, respectively. In Step S22, upon receiving the recall signal, a slave control device currently possessing the access right of the data bus returns the access right of the data bus back to the master control device within a predetermined time period.

In conclusion, in a memory sharing system provided by the present invention, a master control device provides a memory clock signal to a memory device, and each of slave control devices delay phase-locks the memory clock signal via a built-in DLL, such that each of the slave control device can track a phase of the inputted memory clock signal to align an output signal of the slave control device with that of the memory clock signal, so as to provide a reference for access of the memory device. Accordingly, the memory sharing system provided by the present invention is capable of meeting requirements of a new generation memory with a high data transmission rate, e.g., DDR-DRAM, and reducing cost and the number of pins and memory. According to the present invention, through an approach of transmitting an all-page-close command to the memory device via the control device currently possessing the access right of the data bus or an approach of facilitating control devices not yet possessing the access right of the data bus to monitor and track data transmission of the data bus, page conflict prevalent in the prior art is avoided. Since the master control device only activates the memory clock signal of the memory device when a data access is needed, power consumption of the memory device can be effectively reduced.

In conclusion, according to an embodiment of the present invention, a memory sharing system comprises a master control device, a slave control device and a memory device. The master control device transmits a memory clock signal to the memory device. The slave control device is coupled to the master control device. Both of the master control device and the slave control device are coupled to the memory device via a data bus. The slave control device comprises a DLL for receiving the memory clock signal. The DLL tracks the memory clock signal. The master control device and the slave control device access the memory device via the data bus. Preferably, the slave control device transmits a request signal to the master control device to request an access right of the memory device, and the master control device may transmit a grant signal in response to the request signal to grant the access right of the memory device to the slave control device. Preferably, the master control device simultaneously monitors data transmission of the data bus. When the master control device is to recall the access right of the data bus, it transmits a recall signal to the slave control device, which returns the access right of the data bus back to the master control device within a predetermined time period according to the recall signal. Preferably, the slave control device returns the access right of the data bus after it transmits an all-page-close command to the memory device. The master control device or the slave control device periodically transmits a refreshing command to the memory device. The DLL receives the memory clock signal, and tracks a phase of the memory clock signal to generate an output signal, e.g., a data strobe signal or a command signal, for providing the slave control device accessing the memory device via the data bus. Preferably, the master control device further generates a clock enable signal to the memory device, and selectively generates the memory clock signal to the memory device in response to the clock enable signal.

According to another embodiment of the present invention, a memory sharing method applied to a memory sharing system comprises a master control device, a slave control device and a memory device. The memory sharing method comprises the master control device selectively generating a clock signal to the memory device; the slave control device receiving the clock signal, and a DLL tracking the clock signal to generate an output signal, e.g., a data signal, a data strobe signal or a command signal to align the output signal with the clock signal; and the master control device arbitrating the access right of the memory device. Preferably, the slave control device transmits a request signal to the master control device to request for an access right of the memory device, and the master control device transmits a grant signal to the slave control device in response to the request signal. Preferably, the master apparatus transmits a recall signal to the slave control device, which returns the access right of the memory device back to the master control device within a predetermined time period in response to the recall signal.

While the invention has been described in terms of what is presently considered to be the most practical and preferred embodiments, it is to be understood that the invention need not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A memory sharing system, comprising:
    a memory device;
    a master control device, coupled to the memory device via a data bus, for transmitting a clock signal to the memory device; and
    a slave control device, coupled to the memory device via the data bus and coupled to the master control device, comprising a delay phase locked loop (DLL), the slave control device receiving the clock signal, with the DLL tracking a phase of the clock signal, wherein the DLL receives the clock signal, and tracks a phase of the clock signal to generate an output signal that is provided to the slave control device accessing the memory device via the data bus;
    wherein the master control device and the slave control device access the memory device via the data bus,
    wherein the memory device is a double data rate dynamic random access memory (DDR-DRAM),
    wherein the slave control device transmits a request signal to the master control device to request an access right of the memory device, and the master control device transmits a grant signal in response to the request signal to grant the access right of the memory device to the slave control device, and
    wherein the access right of the memory device is returned after the slave control device transmits an all-page-close command to the memory device.

2. The memory sharing system of claim 1, wherein the slave control device periodically transmits a refreshing command to the memory device.

3. The memory sharing system of claim 1, wherein the master control device periodically transmits a refreshing command to the memory device.

4. The memory sharing system of claim 1, wherein when the master control device is to recall the access right of the memory device, the master control device transmits a recall signal to the slave control device, and the slave control device returns the access right of the data bus to the master control device within a predetermined time period according to the recall signal.

5. The memory sharing system of claim 1, wherein the master control device monitors data transmission of the data bus.

6. The memory sharing system of claim 1, wherein a phase of the output signal is aligned with that of the clock signal.

7. The memory sharing system of claim 6, wherein the slave control device is configured to adjust a phase of the output signal using at least one multiplexer.

8. The memory sharing system of claim 1, wherein the output signal is a command signal.

9. The memory sharing system of claim 1, wherein the output signal is a data strobe signal.

10. The memory sharing system of claim 1, wherein the slave control device is coupled to the master control device via a command bus comprising a request signal, a grant signal and a recall signal.

11. The memory sharing system of claim 1, wherein the master control device generates a clock enable signal to the memory device, and selectively generates the clock signal to the memory device in response to the clock enable signal.

12. A memory sharing method, applicable to a memory sharing system comprising a master control device, a slave control device, a data bus and a memory device, the method comprising:
    the master control device selectively generating a clock signal to the memory device;
    the slave control device receiving the clock signal, and tracking the clock signal utilizing a delay phase locked loop (DLL) to generate an output signal aligned with the clock signal; and
    the master control device arbitrating an access right of the memory device,
    wherein the DLL receives the clock signal, and tracks a phase of the clock signal to generate an output signal that is provided to the slave control device accessing the memory device via the data bus,
    wherein the step of the master control device arbitrating an access right of the memory device comprises:
    the slave control device transmitting a request signal to the master control device to request the access right of the memory device;
    the master control device transmitting a grant signal to the slave control device in response to the request signal, and
    the slave control device transmitting an all-page-close command to the memory device before the access right is returned to the master control device.

13. The method of claim 12, further comprising:
    monitoring data transmission of the data bus.

14. The method of claim 12, further comprising:
    periodically transmitting a refreshing command to the memory device.

15. The method of claim 12, wherein the output signal is a data strobe signal or a command signal.

16. The method of claim 12, further comprising adjusting a phase of the output signal using at least one multiplexer.

* * * * *